US 6,774,686 B2

(12) United States Patent
Kennedy et al.

(10) Patent No.: US 6,774,686 B2
(45) Date of Patent: Aug. 10, 2004

(54) METHOD FOR MINIMIZING JITTER USING MATCHED, CONTROLLED-DELAY ELEMENTS SLAVED TO A CLOSED-LOOP TIMING REFERENCE

(75) Inventors: Joseph T. Kennedy, Beaverton, OR (US); Bryan K. Casper, Hillsboro, OR (US); Stephen R. Mooney, Beaverton, OR (US); Aaron K. Martin, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/968,460

(22) Filed: Sep. 28, 2001

(65) Prior Publication Data

US 2003/0062936 A1 Apr. 3, 2003

(51) Int. Cl.⁷ .................................................. H03L 7/06
(52) U.S. Cl. ........................ 327/156; 327/158; 327/161
(58) Field of Search ................................ 327/156–159, 327/161–163; 375/376

(56) References Cited

U.S. PATENT DOCUMENTS

| | | | | |
|---|---|---|---|---|
| 6,011,732 A | * | 1/2000 | Harrison et al. | 365/194 |
| 6,100,733 A | * | 8/2000 | Dortu et al. | 327/149 |
| 6,194,930 B1 | * | 2/2001 | Matsuzaki et al. | 327/156 |
| 6,225,843 B1 | * | 5/2001 | Taniguchi et al. | 327/158 |
| 6,259,293 B1 | * | 7/2001 | Hayase et al. | 327/276 |
| 6,351,166 B2 | * | 2/2002 | Hashimoto | 327/158 |
| 6,377,100 B1 | * | 4/2002 | Fujieda | 327/262 |
| 6,388,485 B2 | * | 5/2002 | Kim | 327/161 |

* cited by examiner

Primary Examiner—Kenneth B. Wells
(74) Attorney, Agent, or Firm—Blakely, Sokoloff, Taylor & Zafman LLP

(57) ABSTRACT

A method for minimizing jitter using substantially matched, controlled, delay elements is disclosed. The method includes generating an internal loop-timing reference, and controlling elements outside of the loop with the internal loop-timing reference generated. In one embodiment the outside elements are substantially identical to those internal to the closed-loop. Controlled delay elements for preconditioning and distributing closed-loop inputs and outputs, using the same control reference used by internal loop elements are disclosed.

13 Claims, 4 Drawing Sheets

METHOD FOR MINIMIZING JITTER USING MATCHED, CONTROLLED-DELAY ELEMENTS SLAVED TO A CLOSED-LOOP TIMING REFERENCE

FIELD OF THE INVENTION

The invention relates generally to the minimizing of jitter in closed-loop applications. More particularly, the invention relates to the minimizing of jitter in a closed-loop application using matched, controlled delay elements outside of the closed-loop system.

BACKGROUND

A closed-loop clock timing reference such as a Delay Locked Loop (DLL) or Phase Locked Loop (PLL) may be configured to generate an internal reference that controls the timing of a loop. This reference tightly controls the delay of the loop elements and jitter in the loop.

Jitter is the deviation or displacement of some aspect of the pulses in a high-frequency digital signal. As the name suggests, jitter can be thought of as shaky pulses. The deviation can be in terms of amplitude, phase timing, or the width of the signal pulse. Among the causes of jitter are electromagnetic interference and crosstalk with other signals. Jitter can cause a display monitor to flicker, affect the ability of the processor in a personal computer to perform as intended, introduce clicks or other undesired effects to audio signals, and cause the loss of data transmitted between network devices. The amount of allowable jitter depends greatly on the application.

BRIEF DESCRIPTION OF THE DRAWINGS

The objects features and advantages of the present invention will be apparent from the following detailed description in which.

DETAILED DESCRIPTION

A closed-loop clock circuit such as a Delay Locked Loop (DLL) or Phase Locked Loop (PLL) may be configured to generate an internal reference that controls the timing of a loop. The internal loop reference tightly controls the delay of the loop elements and minimizes timing variations (jitter) in the loop. This same reference may also be used to control the timing of elements outside the loop. More particularly, jitter can be minimized external to the closed-loop by making these controlled external components substantially identical to the elements of the closed-loops. This process may be used in a variety of circuits and processes, including but not limited to loop input or output signal conditioning, buffering, distribution, or interpolation.

By making the external elements substantially identical to the elements inside the loop and using the internal loop reference to control them, the delay of the elements outside the loop may be tightly controlled and substantially matched to the delay of the elements inside the loop. This arrangement reduces clock channel jitter. The internal loop reference may be composed of a variety of types of signal references, including, but not limited to, voltage, current, differential signals, single-ended signals, analog signals, digital signals, or complimentary signals.

Furthermore, the use of substantially identical elements which are controlled by a common reference throughout the clock channel produces common or constant signal levels at the interfaces between the various circuit blocks that make up the clock channel. By means of this arrangement, the functional range of the device may be extended by making signal levels inherently compatible.

Figure 1:
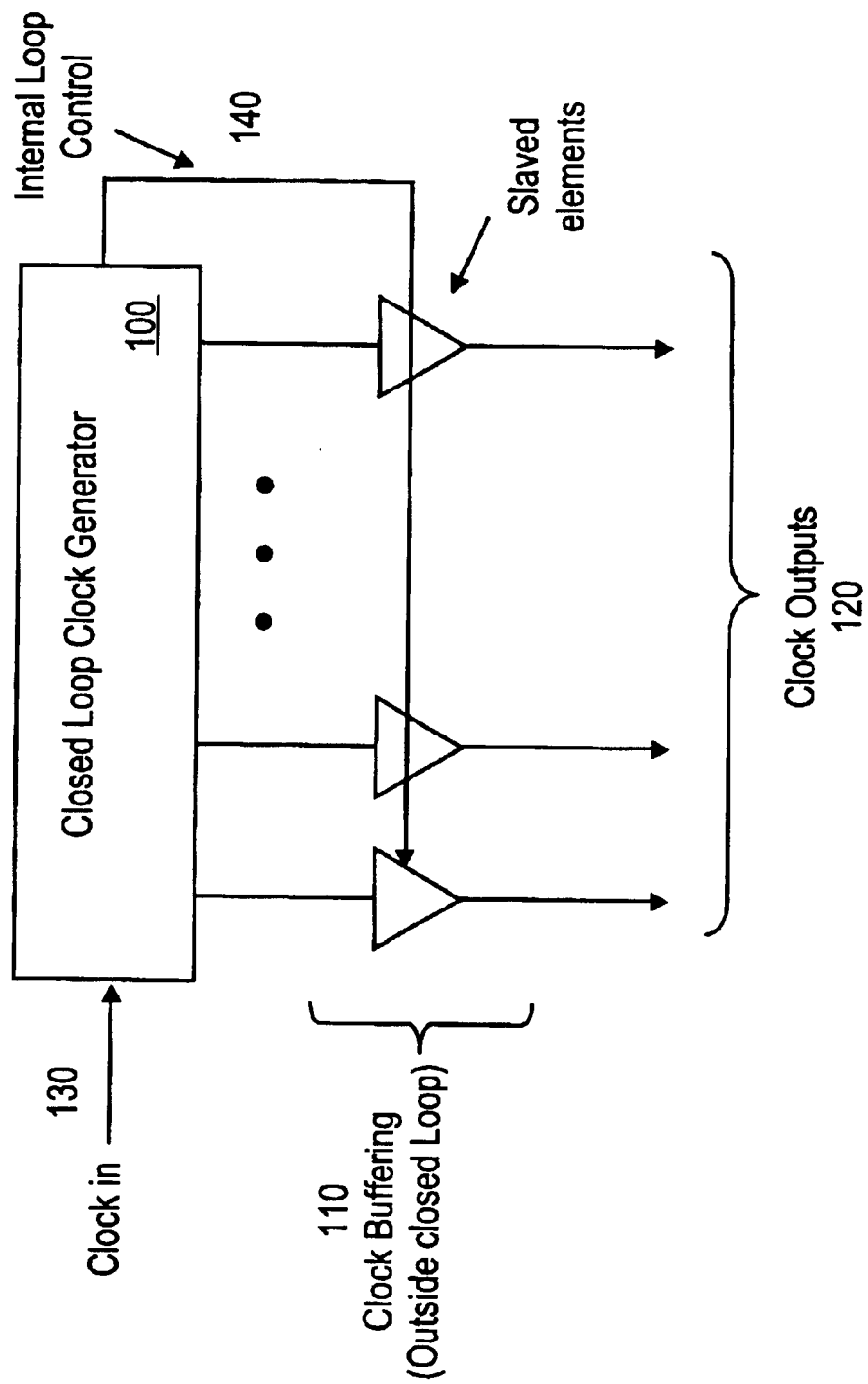
FIG. 1 shows circuitry that uses a closed-loop internal reference to control elements outside the loop in accordance with the teachings of the present invention.

FIG. 1 shows circuitry that may be employed in one embodiment of the invention. Circuit elements include clock input 130, closed-loop clock generator 100, internal loop control line 140, clock buffering elements 110 and clock output 120.

Closed-loop clock generator 100 generates an internal loop reference that controls the timing of the loop. It receives a clock input 130 and produces a control signal that is transmitted along signal line 140. The signal transmitted is used to control the timing of clock buffering elements 110.

Clock buffering elements 110 receive the transmitted control signal from closed-loop clock generator 100 along signal line 140. The timing of the clock buffering elements 110 is controlled by the same reference signal that is used to control elements (shown in FIG. 3 and described below) internal to the closed-loop clock generator 100. In one embodiment external elements, such as the clock buffering elements 110, may be identical or substantially identical to internal loop elements. In other embodiments they may be non identical.

Clock output 120 transmits signals generated by the closed-loop clock generator 100. When controlled elements 110 located externally of the closed-loop clock generator are made identical or substantially identical to controlled elements located inside of the closed-loop clock generator, the delay of these two sets of elements are matched. These delays are seen at the clock outputs 120.

Figure 2:
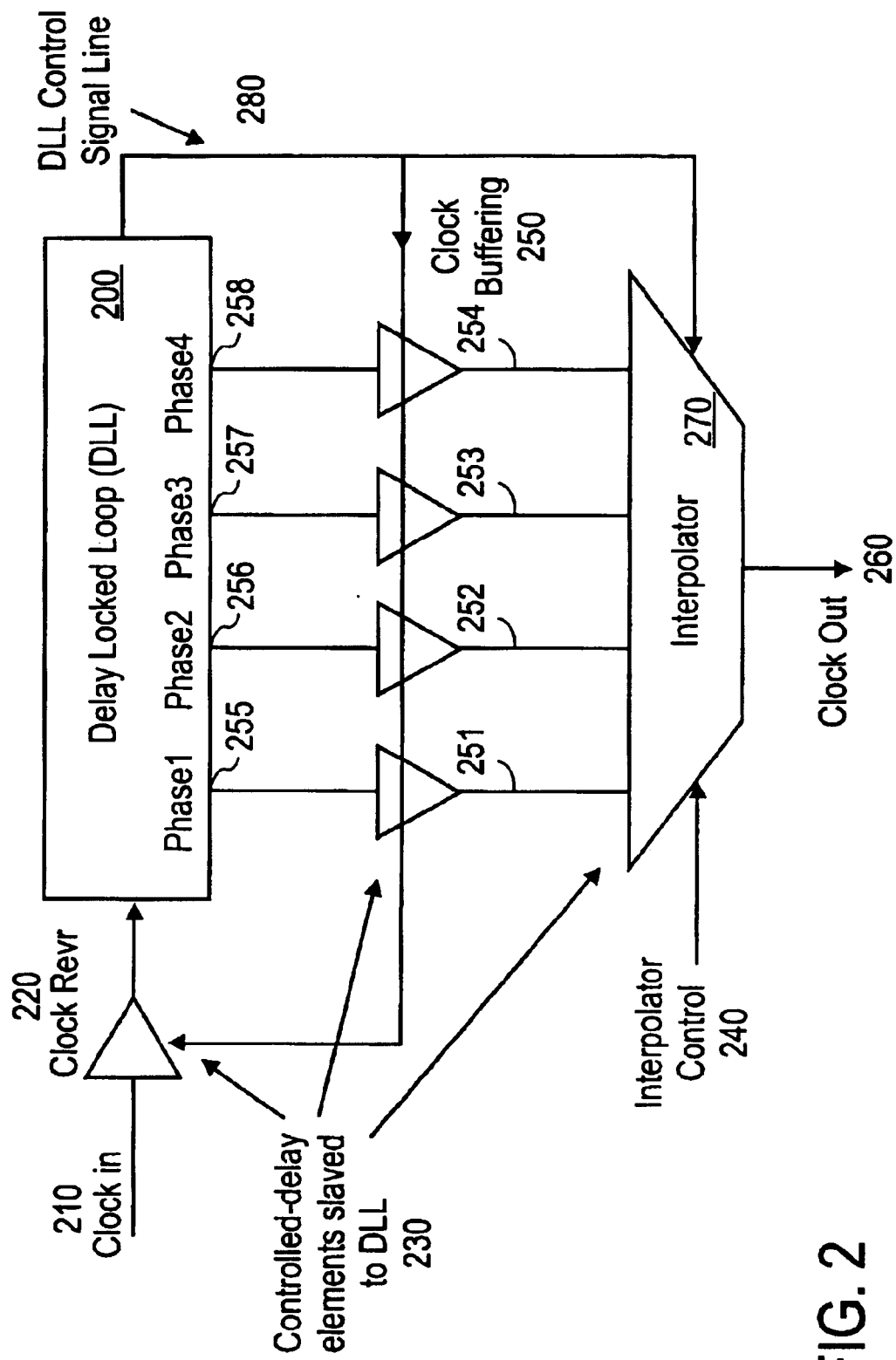
FIG. 2 shows a multi-phase clock generator operating in accordance with the teachings of the present invention.

One embodiment of the invention implementing a multi-phase clock generator is illustrated in FIG. 2. Referring to FIG. 2 there is shown Delay locked loop (DLL) 200, clock input 210, clock receiver 220, clock buffering elements 230, interpolator 270, interpolator control 240 and clock output 260.

DLL 200 receives a clock input 210 via clock receiver 220. DLL 200 generates a DLL control signal along signal line 280. The control signal transmitted along signal line 280 is used to control the external loop elements. The external loop elements controlled by the transmitted signal include clock buffering elements 230, interpolator 270, and clock receiver 220.

Interpolator 270 receives four different phase clock inputs i.e., a different phase signal from 251, 252, 253 and 254 from output taps 255, 256, 257 and 258 of the clock generator 200. These inputs are transmitted via clock buffering elements 250. The interpolator 270 also receives a control signal transmitted from the DLL 200 and a signal from the interpolator control circuitry 240. The interpolator produces a clock output 260. All elements in the external clock path are composed of controlled delay elements which in one embodiment may be identical or substantially identical to those delay elements of the internal loop controlled by the DLL internal controlled voltage. In other embodiments they may be non-identical.

The benefits can be seen, for example, when local operating conditions shift (supply voltage, temperature), the timing of the DLL delay elements may vary causing the clock timing to shift. The DLL may respond to this variation by slewing the loop control voltage to compensate for any shift in delay. The compensation provided operates to keep the clock timing constant. This same shift in operating conditions may also result in timing variation in the elements outside of the DLL loop. This may result because the timing of the elements outside of the DLL loop may be matched to the timing of internal DLL delay elements and thus may see similar variation. As the DLL control voltage slews to compensate for the DLL delay, it will also compensate for the delay of the elements outside the DLL circuit thereby operating to minimize the resultant clock channel jitter. This effect also applies to timing shifts resulting from manufacturing process variation.

Figure 3:
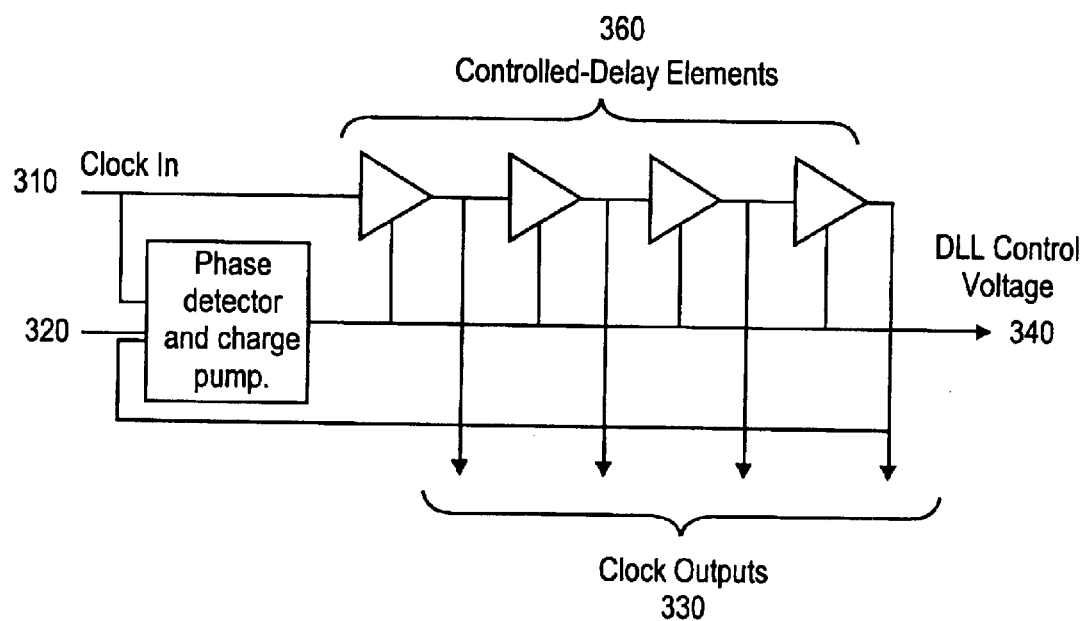
FIG. 3 shows one embodiment of internal elements of an exemplary DLL.

FIG. 3 shows internal elements of one embodiment of an exemplary DLL that operates in accordance with the teachings of the present invention. Referring to FIG. 3 there is shown controlled delay elements 360, clock input 310, phase detector and charge pump 320, DLL control voltage 340 and clock outputs 330.

Controlled delay elements 360 are powered by DLL control voltage 340. This voltage is generated by the phase detector and charge pump 320. Clock inputs are transmitted along signal line 310. The controlled delay elements clock outputs are produced at clock output interface 330.

Figure 4:
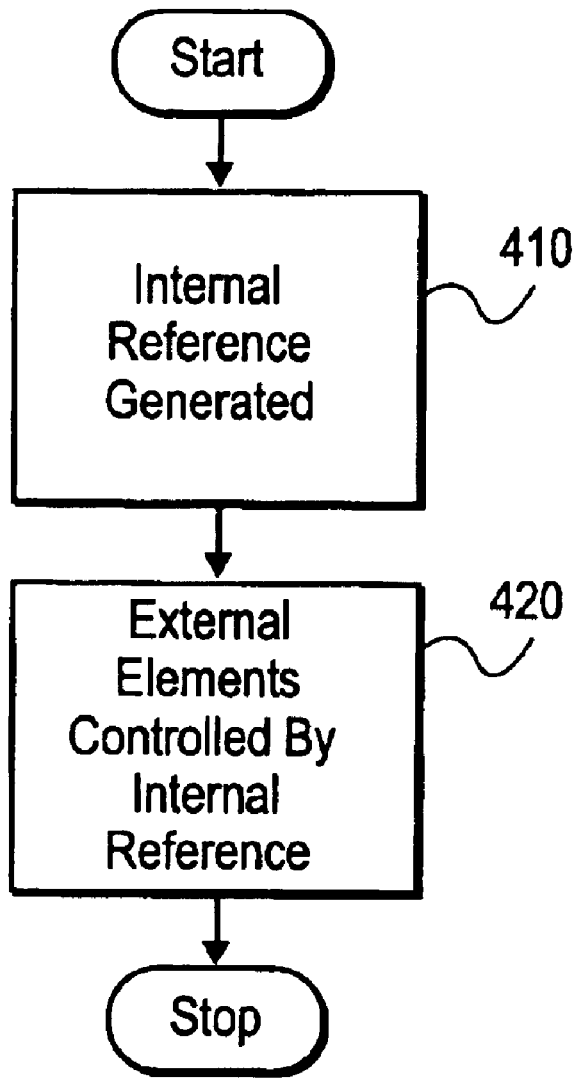
FIG. 4 shows an exemplary process used to reduce jitter in components outside of the closed-loop.

FIG. 4 shows an exemplary process used to reduce loop jitter. At operation 410, an internal reference signal is generated. This internal reference signal controls the timing of the loop. It controls the delay of the loop elements and minimizes timing variation (jitter) in the loop.

At operation 420, the timing reference generated in step 410 is used to control controlled delay elements external to the loop. In one embodiment, these external elements may be substantially identical to the controlled elements internal to the loop. In other embodiments the elements may be identical.

In the foregoing specification, the invention has been described with reference to specific exemplary embodiments thereof. It will however, be evident that various modifications and changes may be made thereto without departing from the broader spirit and scope of the invention as set forth in the appended claims. The specifications and drawings are, accordingly, to be regarded in an illustrative rather than a restrictive sense.

What is claimed is:

1. A method for minimizing jitter comprising:
   generating an internal loop-timing reference from a closed-loop clock generator;
   controlling elements outside of the closed-loop with the generated internal reference, the elements outside of the closed-loop are substantially identical to internal elements of the closed-loop clock generator; and
   controlling an interpolator using the internal loop-timing reference and producing a clock output using the interpolator.

2. The method of claim 1, wherein the controlling comprises controlling the timing of the elements for a process selected from the group consisting of loop input signal conditioning, loop output signal conditioning, signal buffering, signal distribution and signal interpolation.

3. The method of claim 1, wherein the closed-loop clock generator is selected from a group consisting of a delay locked loop (DLL) and a phase locked loop (PLL).

4. The method as set forth in claim 1, wherein generating generates an internal loop-timing reference selected from the group consisting of voltage, current, differential signals, single-ended signals, analog signals, digital signals and complimentary signals.

5. A device for minimizing jitter comprising:
   a closed-loop clock generator generating an internal loop-timing reference; and
   a set of elements external to the closed-loop clock generator and substantially identical to internal elements of the closed-loop clock generator, said set of elements controlled with the internal loop-timing reference; and
   an interpolator coupled to the set of elements to output a clock signal, wherein the interpolator is controlled by the internal loop-timing reference.

6. The device of claim 5, wherein the timing of a set of elements is controlled for a process selected from the group consisting of loop input signal conditioning, loop output signal conditioning, signal buffering, signal distribution and signal interpolation.

7. The device of claim 5, wherein the closed-loop clock generator is selected from a group consisting of a delay locked loop (DLL) and a phase locked loop (PLL).

8. The device of claim 5, wherein generating produces an internal loop-timing reference selected from the group consisting of voltage, current, differential signals, single-ended signals, analog signals, digital signals and complimentary signals.

9. A multi-phase clock generating system comprising:
   a delay locked loop;
   clock buffering elements coupled to the delay locked loop;
   wherein the delay locked loop generates an internal loop-timing reference signal which controls elements outside of the delay locked loop which are substantially identical to internal delay locked loop elements; and
   an interpolator coupled to the clock buffering elements to output a clock signal, wherein the interpolator is controlled by the internal loop-timing reference signal.

10. The system of claim 9, wherein the delay locked loop delivers multiple phase outputs to the clock buffering elements.

11. The system of claim 10, wherein the clock buffering elements deliver multiple phase outputs to the interpolator.

12. The system of claim 11, wherein the interpolator produces a clock output.

13. The system of claim 12, wherein the interpolator has an interpolator control input.

* * * * *